(12) United States Patent
Jeong et al.

(10) Patent No.: US 7,684,246 B2
(45) Date of Patent: Mar. 23, 2010

(54) FLASH MEMORY DEVICE HAVING PUMP WITH MULTIPLE OUTPUT VOLTAGES

(75) Inventors: Yong-Taek Jeong, Daegu Metropolitan (KR); Jin-Yub Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 288 days.

(21) Appl. No.: 11/465,323

(22) Filed: Aug. 17, 2006

(65) Prior Publication Data
US 2007/0115727 A1    May 24, 2007

(30) Foreign Application Priority Data
Nov. 22, 2005    (KR) ................ 10-2005-0111945

(51) Int. Cl.
*G11C 11/34* (2006.01)
*G11C 16/04* (2006.01)

(52) U.S. Cl. ............ 365/185.18; 365/185.23; 365/185.29; 365/189.07

(58) Field of Classification Search ............ 365/185.18, 365/189.07, 189.09, 226, 185.23, 185.29; 327/536
See application file for complete search history.

(56) References Cited

U.S. PATENT DOCUMENTS

| | | | |
|---|---|---|---|
| 5,313,429 A * | 5/1994 | Chevallier et al. ........... 365/226 |
| 6,160,440 A * | 12/2000 | Javanifard et al. ........... 327/536 |
| 6,359,947 B1 * | 3/2002 | Rao ........................... 375/374 |
| 6,373,325 B1 | 4/2002 | Kuriyama |
| 6,605,986 B2 | 8/2003 | Tanzawa et al. |
| 7,072,238 B2 * | 7/2006 | Chae et al. ................. 365/226 |
| 7,200,039 B2 * | 4/2007 | Lee ........................ 365/185.18 |
| 7,239,192 B2 * | 7/2007 | Tailliet ...................... 327/536 |
| 2003/0007389 A1 * | 1/2003 | Ohtani et al. .......... 365/185.29 |
| 2004/0062072 A1 * | 4/2004 | Tanzawa ..................... 365/145 |

FOREIGN PATENT DOCUMENTS

| | | |
|---|---|---|
| JP | 6-334153 | 12/1994 |
| JP | 2001-338493 | 12/2001 |
| KR | 1994-027153 | 12/1994 |
| KR | 10-2004-0002132 | 1/2004 |

OTHER PUBLICATIONS

English language abstract of Japanese Publication No. 6-334153.
English language abstract of Korean Publication No. 1994-027153.
English language abstract of Japanese Publication No. 2001-338493.
English language abstract of Korean Publication No. 10-2004-0002132.

* cited by examiner

*Primary Examiner*—Anh Phung
*Assistant Examiner*—Toan Le
(74) *Attorney, Agent, or Firm*—Myers Bigel Sibley & Sajovec, P.A.

(57) ABSTRACT

A flash memory device may include a pump, a regulator to control the pump so that an output voltage of the pump is substantially maintained at a target voltage, and a control circuit to control the regulator so that the pump selectively generates a program voltage or an erase voltage. In some embodiments, the output voltage of the pump may be stepped in response to program loop iterations during a program operation, or set to a target voltage during an erase operation.

24 Claims, 4 Drawing Sheets

FLASH MEMORY DEVICE HAVING PUMP WITH MULTIPLE OUTPUT VOLTAGES

CROSS-REFERENCE TO RELATED APPLICATIONS

This application claims priority under 35 U.S.C. § 119 from Korean Patent Application 2005-111945 filed on Nov. 22, 2005, the entire contents of which are hereby incorporated by reference.

BACKGROUND

Semiconductor memory devices may be broadly categorized as either volatile or nonvolatile memory devices. The volatile memory devices include static random access memory (SRAM) and dynamic random access memory (DRAM). In static random access memory, data is stored by setting the logical state of a bistable flip-flop. In dynamic random access memory, data is stored by charging a capacitor. Volatile semiconductor memory devices can only store data while power is applied to the device, and the data is lost whenever the power is interrupted.

Nonvolatile semiconductor memory devices such as mask read only memory (MROM), programmable read only memory (PROM), erasable read only memory (EPROM), electrically erasable read only memory (EEPROM), and the like, can store data even when power is not applied to the device. Some nonvolatile memory devices store data permanently, while other may be reprogrammed. Nonvolatile semiconductor memory devices are widely used to store programs and micro code in various technical areas such as computer sciences, avionics, communications, consumer electronics, etc.

Volatile and nonvolatile memories may be combined and applied in one chip for use in systems requiring fast reprogrammable nonvolatile memory. An example of such a memory is a nonvolatile RAM (nvRAM). In addition, specific memory structures including additional logic circuits have been developed to optimize memory performance in application oriented processes.

MROM, PROM, and EPROM generally cannot be reprogrammed by a typical user due to the requirements of the erase and write operations for these devices. However, EEPROM can easily be electrically erased and rewritten. Hence, EEPROM is widely used for data storage in systems that require continuous updating, and in supplementary memory devices. EEPROM (hereinafter, referred to as "flash memory") has a higher integration density compared to conventional EPROM and may be used as a high capacity supplementary memory device.

Flash memory typically requires voltages that are higher than the power supply voltage to carry out erase, program and read operations. These high voltages are typically generated by pumps on the flash memory. Thus, a single memory device may include a high voltage pump, a program voltage pump, an erase voltage pump, a read voltage pump, etc. These pumps occupy large amounts of space on the devices, thereby reducing the overall integration density of the flash memories.

SUMMARY

Some of the inventive principles of this patent disclosure relate to a flash memory device having a pump, a regulator to control the pump so that an output voltage of the pump is substantially maintained at a target voltage, and a control circuit to control the regulator so that the pump selectively generates a program voltage or an erase voltage.

In some embodiments, the regulator may include a voltage divider to divide the output voltage of the pump in response to step signals, a comparator to compare the divided voltage from the voltage divider with a reference voltage and generate a clock enable signal, and a clock driver to output a clock signal to the pump in response to the clock enable signal. The control circuit may sequentially activate the step signals in response to program loop iterations during a program operation and activate any one of the step signals during an erase operation. In some embodiments, the control circuit may include control logic to generate a count-up signal and an operation mode signal to indicate an operational mode, and a step signal generator to generate the step signals in response to the operation mode signal and the count-up signal. During a program operation, the step signal generator may sequentially activate the step signals in response to the count-up signal, and during an erase operation, the step signal generator may activate a predetermined one of the step signals.

In some embodiments, the output voltage of the pump may either be stepped as a program voltage during a program operation or set to a target voltage during an erase operation. The step signal may include a counter to operate in response to the count-up signal, a first signal generator to output first signals in response to an output of the counter during a program operation, a second signal generator to output second signals during an erase operation, and a multiplexer to select as the step signals either the first signals from the first signal generator or the second signals from the second signal generator in response to the operation mode signal. The control circuit may control the pump and the regulator in response to an output from a pass/fail checker, so that the output voltage of the pump is stepped in response to program loop iterations during a program operation, and so that the output voltage of the pump is set to a target voltage during an erase operation.

Some additional inventive principles of this patent disclosure relate to a method including operating a pump on a flash memory device, and regulating the output of the pump to provide a program voltage for the memory device during a program operation and an erase voltage for the memory device during an erase operation. In some embodiments, the method may further include verifying the pass/fail status of selected data during a program operation, and iteratively stepping the output voltage of the pump in response to the pass/fail status of selected data in response to program loop iterations during a program operation. The erase voltage may be regulated in response to a stored target value which may be reprogrammed with a predetermined value.

DETAILED DESCRIPTION

The inventive principles of this patent disclosure will be described below with reference to the accompanying drawings. The inventive principles may, however, be embodied in different forms and should not be constructed as limited to the embodiments set forth herein.

Figure 1:
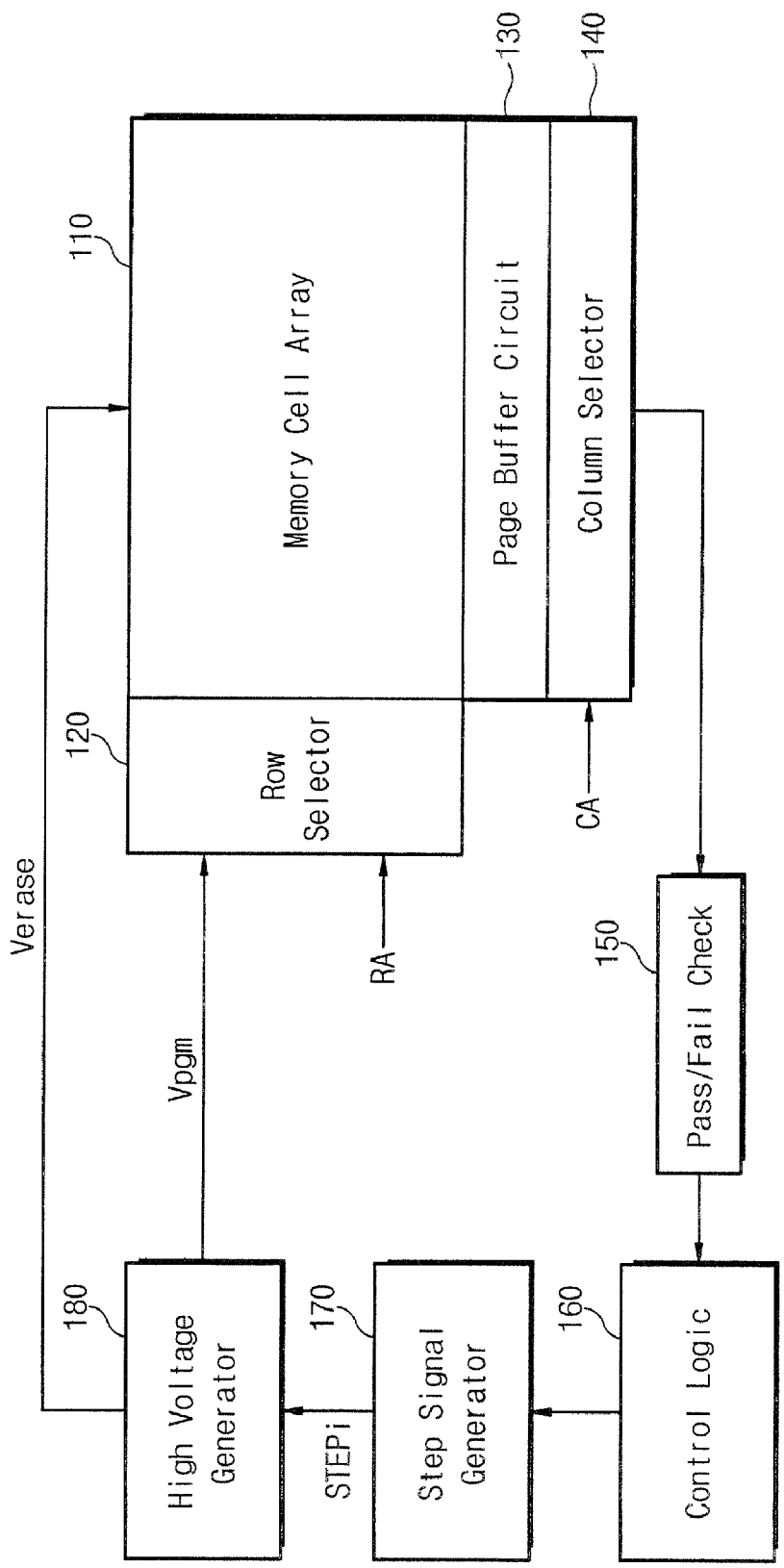
FIG. 1 is a schematic block diagram showing an embodiment of a flash memory device in accordance with some of the inventive principles of this patent disclosure.

FIG. 1 is a schematic block diagram illustrating an exemplary embodiment of a flash memory device in accordance with the inventive principles of this patent disclosure. A flash memory device of the present invention may be embodied as a NAND flash memory device. However, the inventive principles should not be constructed as limited to the embodiments set forth herein. For instance, the inventive principles may be applied to any memory device using pumps to achieve various voltages higher than a power supply voltage.

Referring to FIG. 1, the flash memory device includes a memory cell array 110 for storing data. The memory cell array 110 may be comprised of memory cells (not shown) arranged in rows and columns. The memory cell array 110 may include one or more memory blocks. The memory blocks may have the same structure, for example, a NAND string structure. A row selector 120 may be controlled by control logic 160 and may selectively drive rows of the memory cell array 110 in response to a row address RA. A page buffer circuit 130 may include page buffers corresponding to columns of the memory cell array 110. The page buffer circuit 130 may serve as a sense amplifier or a write driver depending on the mode of operation. For example, the page buffer circuit 130 serves as a write driver during a program operation and as a sense amplifier during a read operation. A column selector 140 is controlled by the control logic 160 and selects columns or page buffers of the page buffer circuit 130 in given units (e.g., x8, x16, x32, etc.). Data bits from selected page buffers may be sent to a pass/fail checker 150. Alternatively, external program data may be loaded on selected page buffers through the column selector 140 during a program operation. The pass/fail checker 150 determines the pass/fail status of selected data from the column selector 150.

The control logic 160 controls the overall operation of the flash memory device. The control logic 160 may control a step signal generator 170 in response to pass/fail information from the pass/fail checker 150 and the current operational mode of the memory array. The step signal generator 170 is controlled by the control logic 160 and selectively activates step signals STEPi (i=0, . . . , m−1, where m is an integer) based on the operation mode. For example, during a program operation, the step signal generator 170 activates the step signals STEPi to generate a program voltage that may be iteratively stepped up as a program loop is repeated. The high voltage generator 180 operates in response to the step signals STEPi and generates a program voltage Vpgm or an erase voltage Verase according to the operation mode. The high voltage generator 180 may have a unified pump and regulator structure to generate the program voltage Vpgm and the erase voltage Verase. The program voltage Vpgm may be supplied to a selected row/word line through the row selector 120 during a program operation. The erase voltage Verase may be supplied to a bulk region of the memory cell array 110 or a selected memory block of the memory cell array 110 during an erase operation.

In one exemplary embodiment, the control logic 160 and the step signal generator 170 constitute a control circuit that controls a regulator so either a program voltage or an erase voltage is selectively generated by the pump.

Although not shown in the figures, a flash memory device according to the inventive principles may include more elements such as a pass voltage generator for generating a pass voltage, a read voltage generator for generating a read voltage, a voltage generator for generating a higher voltage than the program voltage, and so on.

As described above, a flash memory device according to the inventive principles may generate a program voltage Vpgm or an erase voltage Verase using the high voltage generator 180 having a unified pump and regulator structure, depending on the operational mode. Thus, the inventive principles may be able to improve the integration density of a flash memory chip by using the same pump and regulator for both program voltage and erase voltage generation, without needing an extra pump and regulator to generate the erase voltage. In general, since the pump capacity for a program voltage may be larger than that for an erase voltage, it may be possible to generate the program and erase voltages Vpgm and Verase using a pump and regulator for the program voltage. However, in a case where the pump capacity for an erase voltage is larger than that for a program voltage, it may be possible to generate the program and erase voltages Vpgm and Verase using the pump and regulator for the erase voltage.

Figure 2:
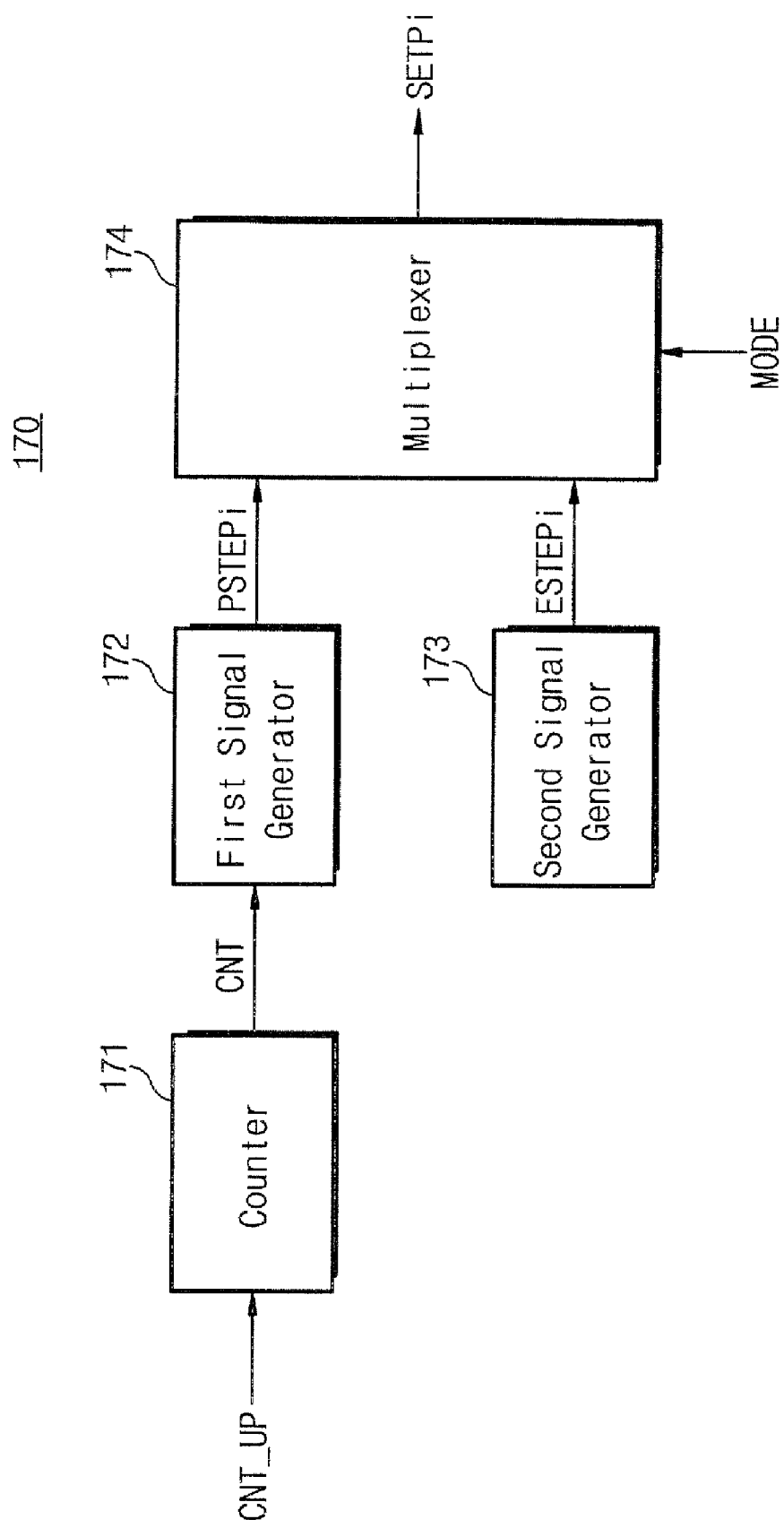
FIG. 2 is a block diagram of an embodiment of a step signal generator in accordance with some of the inventive principles of this patent disclosure.

FIG. 2 illustrates an exemplary embodiment of a step signal generator suitable for use with the system of FIG. 1 according to the inventive principles of this patent disclosure. Referring to FIG. 2, the step signal generator 170 operates responsive to a count-up signal CNT_UP and an operation mode signal MODE from control logic 160 and generates step signals STEPi (i=1, . . . , m−1, where m is an integer). The step signal generator 170 includes a counter 171, a first signal generator 172, a second signal generator 173 and a multiplexer 174. The counter 171 operates in response to the count-up signal CNT_UP, which is pulsed when a program loop is repeated. The counter 171 counts in synchronization with the count-up signal CNT_UP and a counted value CNT (i.e., the output of the counter) may be incremented with a predetermined value (for example, 1). The first signal generator 172 generates first signals PSTEPi in response to the output CNT of the counter 171. The first signals PSTEPi may be sequentially activated as the output of the counter 171 is sequentially increased by the count-up signal CNT_UP. In a first program loop during a program operation, the output CNT of the counter 171 may be initialized by the control logic 160 in FIG. 1 so as to activate a first signal PSTEP0 selected from the first signals PSTEPi. However, in response to the count tip signal CNT_UP and with an increment in the CNT value, a subsequent signal (for example, PSTEP1) may be activated.

The second signal generator 173 generates second signals ESTEPi. In an example embodiment, the second signal generator 173 stores a code of step signals required to generate an erase voltage, and generates the second signals ESTEPi based on the stored code. During an erase operation, one of the second signals ESTEPi may be activated to set the erase voltage to a target voltage. It may be possible to change the erase voltage to another target voltage. That is, the second signal generator 173 may be configured to vary the stored code. For example, the second signal generator 173 may include a register and an option circuit. The register may store a code to generate a default value for the erase voltage. The option circuit (e.g., a fuse box) may be programmed to provide an increased/decreased value for the target voltage. In a case where the erase voltage corresponding to the default value is higher or lower than the target voltage, the erase voltage may be reestablished to a target voltage by programming the option circuit. The multiplexer 174 selects an output PSTEPi from the first signal generator 172 or an output ESTEPi from the second signal generator 173 in response to the operation mode signal MODE. Then, the multiplexer 174 outputs the selected signals as the step signals STEPi to the high voltage generator 180. For instance, the multiplexer 174 may select the output PSTEPi from the first signal generator 172 as the step signals STEPi when the operation mode signal MODE indicates a program operation mode. The multiplexer 174 selects the output ESTEPi of the second signal generator 173 as the step signals STEPi when the operation mode signal MODE indicates an erase operation mode.

As explained above, the step signal generator 170 may be configured to generate the step signals STEPi for both a program operation and an erase operation. In other words, the inventive principles may generate the step signals STEPi required for a program operation and an erase operation by means of a unified step signal generator 170.

Figure 3:
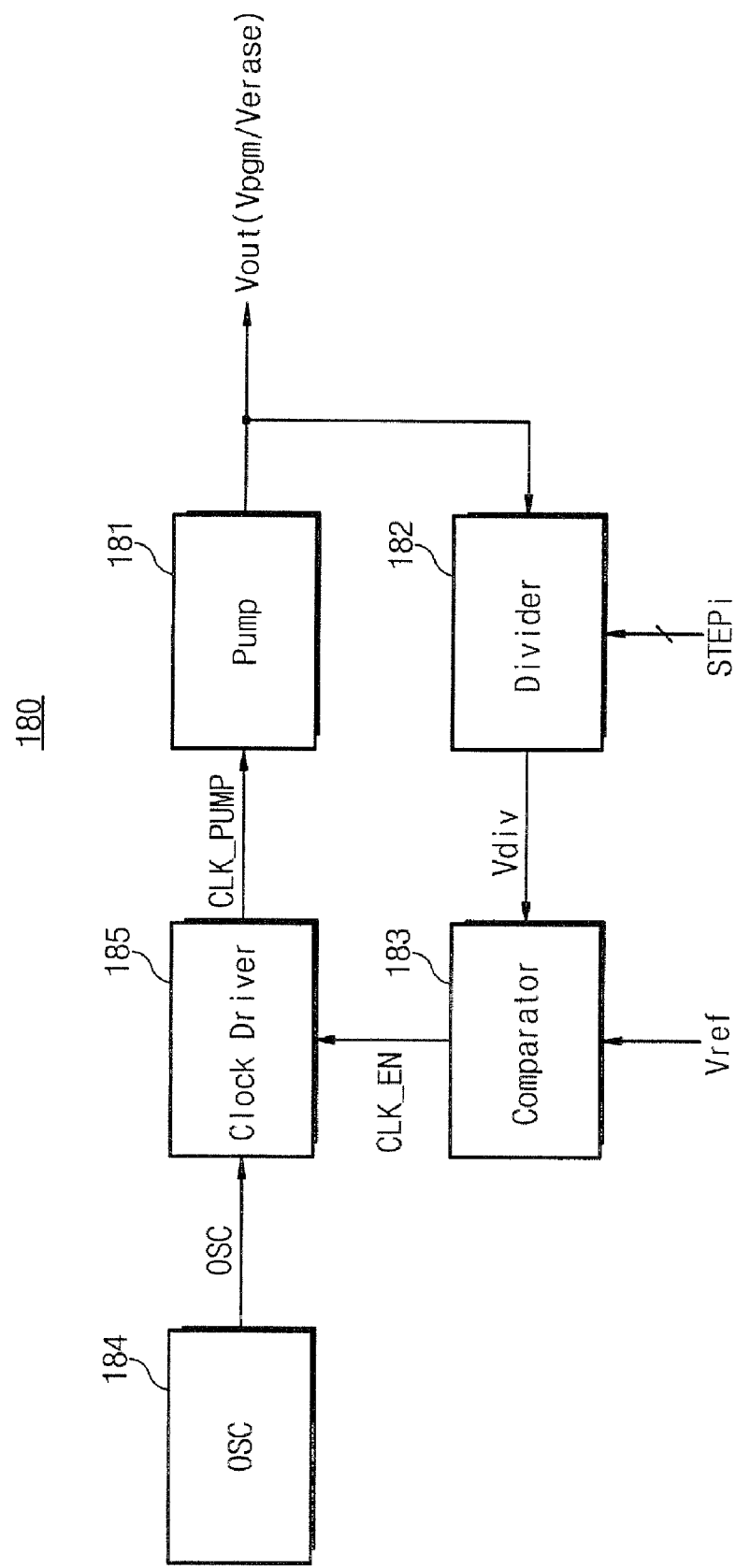
FIG. 3 is a block diagram of an embodiment of a high voltage generator in accordance with some of the inventive principles of this patent disclosure.

FIG. 3 is an exemplary embodiment of a high voltage generator suitable for use in the system of FIG. 1 according to the inventive principles of this patent disclosure. Referring to FIG. 3, the high voltage generator 180 includes a pump 181, a voltage divider 182, a comparator 183, an oscillator 184, and a clock driver 185. The voltage divider 182, the comparator 183 and the clock driver 185 may constitute a regulator designed to regulate and maintain an output voltage Vout.

The pump 181 generates a high voltage Vout (which may be used as a program voltage Vpgm or an erase voltage Verase) in response to a clock signal CLK_PUMP from the clock driver 185. The voltage divider 182 receives the high voltage Vout from the pump 181 and divides the high voltage Vout in response to the step signals STEPi from the step signal generator 170. The divided voltage Vdiv is supplied to the comparator 183. The comparator 183 compares the divided voltage Vdiv with a reference voltage Vref and then generates a clock enable signal CLK_EN in response to the results of the comparison. The comparator 183 enables the clock enable signal CLK_EN when the divided voltage Vdiv from the voltage divider 182 is lower than the reference voltage Vref or when the high voltage Vout (i.e., a program voltage or an erase voltage) from the pump 181 does not reach a target voltage. The clock driver 185 outputs an oscillation signal OSC from the oscillator 184 as a clock signal CLK_PUMP when the CLK_EN signal is activated. Thus, with feedback from the regulator circuit (consisting of the voltage divider 182, comparator 183, clock driver 185), the pump 181 operates so that the output voltage Vout is substantially maintained at a target voltage. When the enable signal CLK_EN is deactivated, the oscillation signal OSC is no longer output as the clock signal CLK_PUMP. This means that the pump 181 does not operate. However, the inventive principles are not limited to this particular pump driving scheme. Any other suitable method can be used to control the voltage output of the pump, e.g., in response to the feedback from the regulator (comprising of the voltage divider 182, comparator 183, and clock driver 185).

The step signals STEPi applied to the voltage divider 182 are sequentially activated by the step signal generator 170 so that the output voltage Vout of the pump 181, that is, the program voltage Vpgm is stepped up in response to program loop iterations (during program mode). During an erase operation, one of the step signals STEPi (i.e., a predetermined step signal) is activated so that the high voltage Vout from the pump 181 has a target voltage during the erase operation. As described above, the voltage regulator (182, 183 and 185) and the pump 181 are used to generate an erase voltage Verase during an erase operation and a program voltage Vpgm during a program operation. Thus, a flash memory device according to the inventive principles may have a unified regulator and pump structure for generating an erase and a program voltage, thereby eliminating the need for separate pumps and regulators for generating an erase voltage and a program voltage. Thus, the chip area usage efficiency (or integration density of a chip) may be improved.

Figure 4:
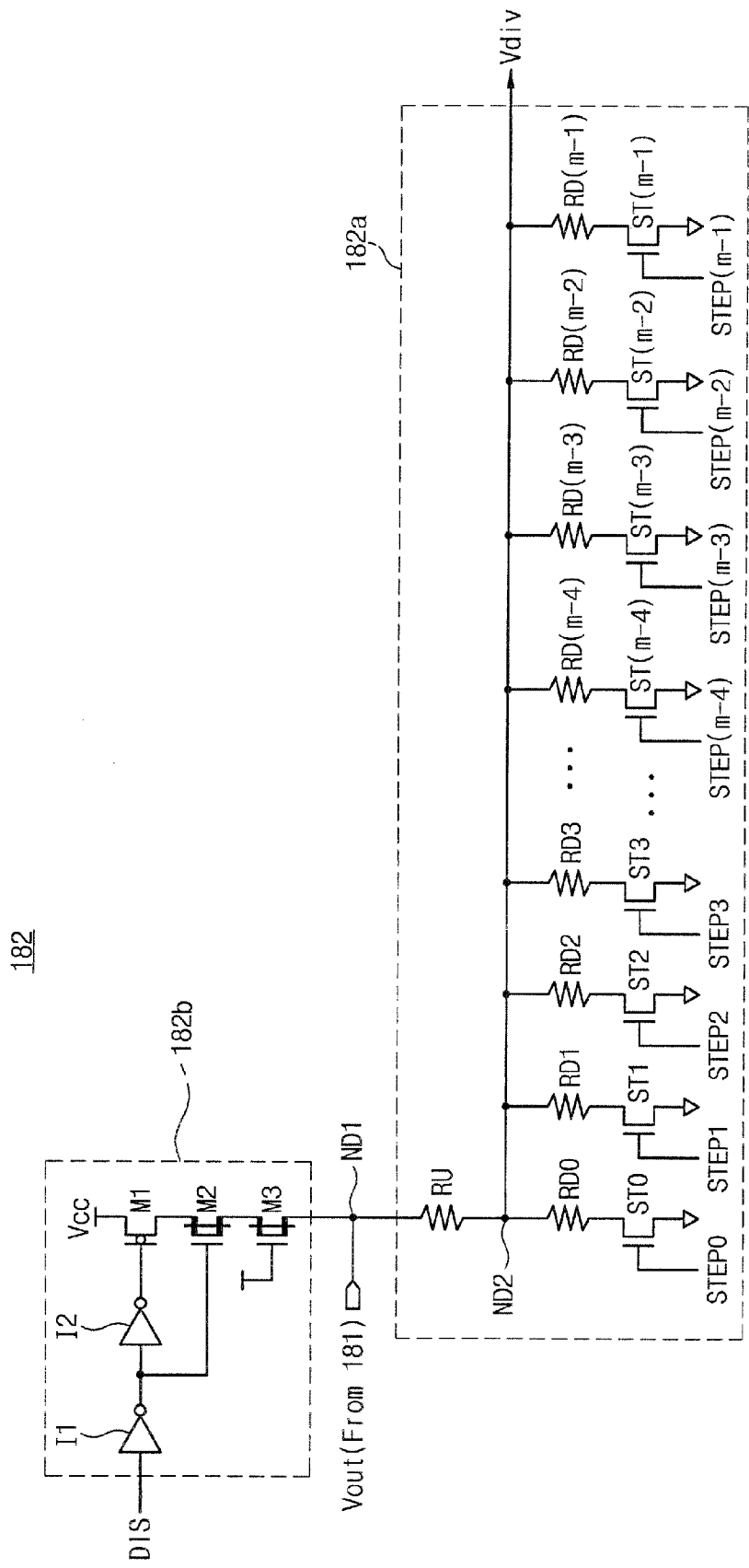
FIG. 4 is a circuit diagram showing an embodiment of a voltage divider in accordance with some of the inventive principles of this patent disclosure.

FIG. 4 illustrates an exemplary embodiment of a voltage divider suitable for use with the system of FIG. 3 according to the inventive principles of this patent disclosure. Referring to FIG. 4, the voltage divider 182 includes a voltage dividing unit 182a and a discharging unit 182b. The voltage dividing unit 182a includes a resistor RU and a plurality of resistors RD0~RD(m−1) and switch transistors ST0~ST(m−1). The resistor RU is connected between a node ND1 that receives the high voltage output Vout from the pump 181 in FIG. 3 and a node ND2 that outputs a divided voltage Vdiv. The resistors RD0~RD(m−1) correspond to the switch transistors ST0~ST(m−1), respectively. The resistors RD0~RD(m−1) are connected in parallel between the node ND2 and a ground node via the corresponding switch transistors ST0~ST(m−1). The switch transistors ST0~ST(m−1) are controlled by corresponding step signals STEP0~STEP(m−1), respectively. The discharging unit 182b discharges the voltage at the node ND1 to a power supply voltage Vcc in response to a control signal DIS.

Hereinafter, an operation of a flash memory device will be fully explained with reference to the drawings. As known to those skilled in the art, the program operation is performed through a plurality of program loops, each of which includes a data load interval, a bit line setup interval, a program execute interval, a discharge interval, a verify read interval, and a column scan interval.

When the program operation begins, the multiplexer 174 in FIG. 2 selects an output PSTETi from the first signal generator 172 as step signals STEPi in response to the operation mode signal MODE. In this case, the output CNT of the counter 172 may be controlled by control logic 160 so that a program voltage Vpgm is set to an initial voltage. For instance, the output CNT of the counter 171 may be set so that step signal STEP0 of the step signals STEPi is activated. As the step signal STELP0 is activated, switch transistor ST0 in FIG. 4 is turned on. This would set the output voltage Vout of pump 181 to a start voltage.

During the data load interval, program data is loaded into page buffer circuit 130 through column selector 140. During the bit line setup interval, a bit line program voltage (e.g., a ground voltage) or a bit line program exhibit voltage (e.g., a power supply voltage) is applied to each of the bit lines according to the loaded program data in the page buffer circuit 130. During the program execute interval, the program voltage Vpgm from the high voltage generator 180 may be applied to a selected word line through the row selector 120. In this case, a pass voltage from the pass voltage generator (not shown) is applied to non-selected word lines. When the program execute interval is ended, the voltages to the word lines are discharged during the discharge interval. The verify read operation is carried out to verify the programming of the memory cells of the selected word line. During the verify read operation, the page buffer circuit 130 senses data bits in the memory cells of the selected word line. During the column scan interval, the data bits sensed by the page buffer circuit 130 are sent to a pass/fail checker 150 through the column selector 140 in a specific unit. The pass/fail checker 150 determines the pass/fail status of the input data bits.

When the output of the pass/fail checker 150 indicates a program pass, the column scan operation is continuously carried out in the same manner described above. However, if the output of the pass/fain checker 150 indicates a program fail, the control logic 160 stops the column scan operation and executes another program loop. In this case, the control logic 160 outputs a pulsed count-up signal CNT_UP. As a result, the output CNT of counter 171 in FIG. 2 is increased by a predetermined value (e.g., 1) based on the pulsed count-up signal CNT_UP. This means that another step signal (for example, PSTEP1) of the steps signals PSTETi is activated. The activated step signal PSTEP1 is sent to a voltage divider 182 through a multiplexer 174. As a result, the high voltage Vout from a pump 181, that is, the program voltage Vpgm may be boosted by a predetermined increment. The above-described operation may be repeated until all memory cells in the selected word line are programmed.

When an erase operation begins, the second signal generator 173 in FIG. 2 activates one (for example, ESTEP(m−4)) of the signals ESTEPi so that an erase voltage Verase has a predetermined voltage. An output ESTEPi of the second signal generator 173 is transferred to the voltage divider 182 through the multiplexer 174 that is controlled by the operation mode signal MODE. A switch transistor ST(m−4) is turned on as the step signal STEP(m−4) is activated. Thus, the high voltage Vout from the pump 181 (i.e., the erase voltage Verase) may be set to a target voltage in the above-described maimer. During the erase operation, the erase voltage Verase is applied to a bulk region of a memory cell array 110. In this case, word lines of the memory cell array 110 may be set to a ground voltage through a row selector 120 under the control of the control logic 160. Once the memory cells of the memory cell array 110 are erased, a verify read operation may be performed to determine whether memory cells are actually erased or not. The verify read operation and the column scan operation are performed with respect to respective word lines. The verify read and column scan operations of each word line are performed in the same manner as the above-described program operation. Therefore, the verify read and column scan operations for the erase operation will not be explained further. In some embodiments, the erase operation may be carried out only once. If data selected through the column selector 140 is judged to have failed to erase, the erase operation may be terminated as a failed operation.

Since the embodiments described above can be modified in arrangement and detail without departing from the inventive concepts, such changes and modifications are considered to fall within the scope of the following claims.

The invention claimed is:

1. A flash memory device comprising:
a pump;
a regulator to control the pump so that an output voltage of the pump is substantially maintained at a target voltage, wherein the regulator comprises a voltage divider to divide the output voltage of the pump in response to step signals, a comparator to compare the divided voltage from the voltage divider with a reference voltage and generate a clock enable signal, and a clock driver to output a clock signal to the pump in response to the clock enable signal; and
a control circuit to control the regulator so that the pump selectively generates a program voltage or an erase voltage.

2. The device of claim 1, wherein the control circuit sequentially activates the step signals in response to program loop iterations during a program operation and activates any one of the step signals during an erase operation.

3. The device of claim 2, wherein the control circuit comprises:

control logic to generate a count-up signal and a operation mode signal to indicate an operational mode; and
a step signal generator to generate the step signals in response to the operation mode signal and the count-up signal.

4. The device of claim 3, wherein during the program operation, the step signal generator sequentially activates the step signals in response to the count-up signal.

5. The device of claim 3, wherein during the erase operation, the step signal generator activates a predetermined one of the step signals.

6. The device of claim 3, wherein the step signal generator comprises:
a counter to operate in response to the count-up signal;
a first signal generator to output first signals in response to an output of the counter during the program operation;
a second signal generator to output second signals during the erase operation; and
a multiplexer to select as the step signals either the first signals from the first signal generator or the second signals from the second signal generator in response to the operation mode signal.

7. The device of claim 6, wherein the first signal generator sequentially activates the first signals in response to the output of the counter during the program operation.

8. The device of claim 6, wherein the second generator activates a predetermined signal of the second signals during the erase operation.

9. The device of claim 1, wherein the voltage divider comprises:
a discharging unit to discharge a first node coupled to receive the output voltage of the pump; and
a dividing unit to divide the output voltage of the pump received at the first node and output the divided voltage to a second node.

10. The device of claim 9, wherein dividing unit comprises:
a first resistor coupled between the first node and the second node;
second resistors connected to the second node in parallel; and
switch transistors coupled between corresponding second resistors and a ground node, and controlled by corresponding step signals.

11. The device of claim 1, wherein the output voltage of the pump is either stepped as the program voltage during a program operation or set to the target voltage during an erase operation.

12. A flash memory device comprising:
a pump;
a regulator to control the pump so that an output voltage of the pump is substantially maintained at a target voltage;
a control circuit to control the regulator so that the pump selectively generates a program voltage or an erase voltage;
a memory cell array having memory cells arranged in rows and columns;
a row selector to select one of the rows and drive the selected row with the program voltage;
a page buffer circuit to sense data bits from the memory cell array through the columns;
a column selector to select the data bits sensed by the page buffer circuit; and
a pass/fail checker to check the data bits selected by the column selector.

13. The device of claim 12, wherein the control circuit controls the pump and the regulator in response to an output from the pass/fail checker, so that the output voltage of the pump is stepped in response to program loop iterations during a program operation, and so that the output voltage of the pump is set to the target voltage during an erase operation.

14. The device of claim 13, wherein the control logic activates the step signals sequentially based on an output of the pass/fail checker during the program operation and activates one of the step signals during the erase operation.

15. A method comprising:
operating a pump on a flash memory device;
operating a regulator for the purpose of regulating the output of the pump to provide a program voltage for the memory device during a program operation and an erase voltage for the memory device during an erase operation;
verifying the pass/fail status of selected data during the program operation; and
stepping the output voltage of the pump in response to the pass/fail status of selected data.

16. The method of claim 15, further comprising repeating the verifying and stepping in response to program loop iterations during the program operation.

17. The method of claim 15, wherein the erase voltage is regulated in response to a stored target value.

18. The method of claim 17, wherein the stored target value may be reprogrammed.

19. The method of claim 15 wherein the output of the pump is regulated to a target voltage that is capable of being changed during operation of the flash memory device.

20. A flash memory device comprising:
a memory cell array;
means for generating a high voltage for the memory cell array in response to step signals; and
means for generating the step signals so the high voltage is a first voltage during a first operation and a second voltage during a second operation.

21. The device of claim 20, wherein the means for generating the high voltage includes:
means for generating the high voltage in response to a clock signal;
means for generating a divided signal by dividing the high voltage in response to the step signals; and
means for generating the clock signal in response to the divided signal.

22. The device of claim 20, wherein the means for generating the step signals includes:
means for generating first signals in response to a counter;
means for generating second signals; and
means for selecting the first signals or the second signals as the step signals in response to a mode signal.

23. The device of claim 20, further comprising:
means for verifying the pass/fail status of selected data from the memory cell array during a program operation; and
means for iteratively changing the step signals in response to the pass/fail status of selected data during the program operation.

24. The device of claim 20, wherein the first voltage is a program voltage, the second voltage is an erase voltage, the first operation is a program operation, and the second operation is an erase operation.

* * * * *